United States Patent
Nakamura

(10) Patent No.: US 9,064,990 B2
(45) Date of Patent: Jun. 23, 2015

(54) ULTRAVIOLET SENSOR AND METHOD FOR MANUFACTURING THE SAME

(71) Applicant: Murata Manufacturing Co., Ltd., Nagaokakyo-Shi, Kyoto-fu (JP)

(72) Inventor: Kazutaka Nakamura, Nagaokakyo (JP)

(73) Assignee: MURATO MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 13/706,435

(22) Filed: Dec. 6, 2012

(65) Prior Publication Data

US 2013/0092933 A1    Apr. 18, 2013

Related U.S. Application Data

(63) Continuation of application No. PCT/JP2011/063581, filed on Jun. 14, 2011.

(30) Foreign Application Priority Data

Jun. 21, 2010   (JP) .................................. 2010-140464

(51) Int. Cl.
| | |
|---|---|
| *H01L 31/0296* | (2006.01) |
| *H01L 31/109* | (2006.01) |
| *H01L 31/18* | (2006.01) |
| *H01L 31/0328* | (2006.01) |

(52) U.S. Cl.
CPC .......... *H01L 31/0296* (2013.01); *H01L 31/109* (2013.01); *H01L 31/18* (2013.01); *H01L 31/1828* (2013.01); *H01L 31/0328* (2013.01)

(58) Field of Classification Search
CPC ............ H01L 29/7869; H01L 31/1804; H01L 31/0296; H01L 29/78633; H01L 29/66742; H01L 31/02; H01L 31/18

USPC ................. 257/21, 43, 59, 72, 431, 680, 749, 257/E31.13, E31.054, E31.093; 438/57, 71, 438/85, 93, 201, 211, 257, 427, 708
See application file for complete search history.

(56) References Cited

U.S. PATENT DOCUMENTS

| | | | |
|---|---|---|---|
| 7,635,906 B2 | 12/2009 | Nakamura et al. | |
| 2003/0218221 A1* | 11/2003 | Wager et al. | ................... 257/410 |
| 2009/0057805 A1* | 3/2009 | Nakamura et al. | ............ 257/461 |

FOREIGN PATENT DOCUMENTS

| | | | |
|---|---|---|---|
| JP | 2000-106184 A | 4/2000 | |
| JP | 2001-053329 A | 2/2001 | |

(Continued)

OTHER PUBLICATIONS

PCT/JP2011/063581 Written Opinion dated Aug. 12, 2011.

*Primary Examiner* — Fernando L Toledo
*Assistant Examiner* — Lawrence-Linh T Nguyen
(74) *Attorney, Agent, or Firm* — Arent Fox LLP

(57) ABSTRACT

An ultraviolet sensor has a p-type semiconductor layer composed of a solid solution of NiO and ZnO, and an n-type semiconductor layer composed of ZnO and joined to the p-type semiconductor layer such that a part of the surface of the p-type semiconductor layer is exposed. In the p-type semiconductor layer, trivalent Ni is contained in a crystal grain in a state of being solid-solved with the solid solution of NiO and ZnO. The trivalent Ni can be contained in the crystal grain of the p-type semiconductor layer by adding NiOOH to NiO and ZnO, and firing the resulting mixture. Thereby, an inexpensive ultraviolet sensor capable of being downsized, which can easily detect the intensity of ultraviolet light by a photovoltaic power without utilizing a peripheral circuit can be realized.

8 Claims, 4 Drawing Sheets

(56) References Cited

FOREIGN PATENT DOCUMENTS

| JP | 2004-119525 | A | | 4/2004 | |
| JP | 3952076 | B1 | | 8/2007 | |
| JP | 2007-294639 | A | | 11/2007 | |
| JP | 2010-87482 | | * | 8/2009 | |
| JP | 2009-300206 | A | | 12/2009 | |
| JP | 2010087482 | | * | 4/2010 | ............. H01L 31/00 |

* cited by examiner

ULTRAVIOLET SENSOR AND METHOD FOR MANUFACTURING THE SAME

CROSS REFERENCE TO RELATED APPLICATIONS

The present application is a continuation of International application No. PCT/JP2011/063581, filed Jun. 14, 2011, which claims priority to Japanese Patent Application No. 2010-140464, filed Jun. 21, 2010, the entire contents of each of which are incorporated herein by reference.

FIELD OF THE INVENTION

The present invention relates to an ultraviolet sensor, and a method for manufacturing an ultraviolet sensor, and more particularly relates to a photodiode type ultraviolet sensor having a laminate structure in which a p-type semiconductor layer is joined to an n-type semiconductor layer in the form of a hetero junction by using an oxide semiconductor, and a method for manufacturing the same.

BACKGROUND OF THE INVENTION

An ultraviolet sensor has been widely used as a flame sensor for a fire alarm device or a combustion monitoring device of a burner, and as an ultraviolet detection device for measuring the amount of ultraviolet radiation in an outdoor environment. In recent years, an ultraviolet sensor has also been expected to be applied to an optical communication device.

As this type of ultraviolet sensor, hitherto, a sensor using a diamond semiconductor or a SiC semiconductor as a sensing material has been known. However, these diamond semiconductors and SiC semiconductors have defects that the ability of materials to be processed is inferior and the materials are expensive.

Hence, in recent years, the oxide semiconductor which is easy in material processing and relatively inexpensive receives attention, and research on and development of an ultraviolet sensor formed by joining a p-type semiconductor layer to an n-type semiconductor layer in the form of a hetero junction by using these oxide semiconductors.

For example, in Patent Document 1 is disclosed an ultraviolet sensor 106 including a ZnO layer 101 of an n-type oxide semiconductor, a (Ni, Zn) O layer 102 of a p-type oxide semiconductor disposed in contact with the ZnO layer 101, a first terminal electrode 103 electrically connected to the ZnO layer 101, and a second terminal electrode 105 electrically connected to the (Ni, Zn) O layer 102 through a conductive layer 104 made of a transitional metal oxide or the like.

In this Patent Document 1, when the sensor is irradiated with ultraviolet light in a direction of an arrow a, and a depletion layer formed at a junction between an n-type ZnO layer 101 and a p-type (Ni, Zn) O layer 102 is irradiated with ultraviolet light, carriers are excited, and a photocurrent is generated, and thereby; ultraviolet light can be detected.

However, since the carrier concentration of the (Ni, Zn) O layer 102 is extremely lower than the carrier concentration of the ZnO layer 101 and the specific resistance of the (Ni, Zn) O layer 102 cannot be adequately lowered, only a slight photocurrent is generated even though the ZnO layer 101 is irradiated with ultraviolet light. Furthermore, since the slight photocurrent is almost consumed by internal resistance of the (Ni, Zn) O layer 102, it is a fact that the photocurrent cannot be actually detected as a current value.

Therefore, in Patent Document 1, as shown in FIG. 7, a first terminal electrode 103 and a second terminal electrode 105 are formed at the surface side of the ZnO layer 101 and the back side of a conductive layer 104, respectively, and a power source circuit 107 is externally provided, and the intensity of ultraviolet light is detected as changes in a resistance value. That is, when ultraviolet light is irradiated, a voltage is applied to the first terminal electrode 103 and the second terminal electrode 105, and at a resistance 109 disposed in parallel with a power source 108, changes in resistance are measured, and the intensity of ultraviolet light is detected by changes in a resistance value.

Patent Document 1: Japanese Patent Publication No. 3952076

SUMMARY OF THE INVENTION

However, in Patent Document 1, since as described above, the intensity of ultraviolet light has to be detected as changes in a resistance value by externally disposing a power source circuit 107, it is necessary to secure a space for mounting the power source circuit 107. In addition, a resistance which is detected by the power source circuit 107 is high, and therefore a measuring instrument having a high input impedance or an amplifier circuit is additionally required. As described above, in Patent Document 1, there were problems that an expensive peripheral circuit is required and a device becomes large.

In Patent Document 1, as described above, the intensity of ultraviolet light is detected by changes in a resistance value, but the resistance value of the (Ni, Zn) O layer 102 largely fluctuates depending on measurement temperatures, and therefore the resistance values detected by the power source circuit 107 is a combined value of a resistance corresponding to ultraviolet irradiation and a variation of resistance due to a temperature change. Accordingly, there was a problem that a temperature correction is necessary in order to attain only the intensity of ultraviolet light, resulting in the complication of a device.

Moreover, in Patent Document 1, when the (Ni, Zn) O layer 102 is mounted on a substrate, it is difficult to ensure insulating properties since the (Ni, Zn) O layer 102 has a high resistance nearly equal to that of the substrate.

The present invention was made in view of such a situation, and it is an object of the present invention to provide an inexpensive ultraviolet sensor capable of being downsized, which can easily detect the intensity of ultraviolet light by a photovoltaic power without disposing a peripheral circuit, and a method for manufacturing an ultraviolet sensor.

In order to achieve the above-mentioned object, the present inventor made earnest investigations concerning an ultraviolet sensor using (Ni, Zn) O serving as a p-type oxide semiconductor and ZnO serving as an n-type oxide semiconductor, and consequently the present inventor obtained findings that when (Ni, Zn) O serving as the p-type oxide semiconductor contains trivalent Ni, it becomes possible to reduce a resistance of the p-type semiconductor layer, and thereby, the intensity of ultraviolet light can be detected by a photovoltaic power.

The present invention was made based on such findings, and an ultraviolet sensor of the present invention is an ultraviolet sensor comprising a p-type semiconductor layer principally composed of a solid solution of NiO and ZnO, and an n-type semiconductor layer principally composed of ZnO and joined to the p-type semiconductor layer, wherein the p-type semiconductor layer contains trivalent Ni.

In addition, when an internal electrode is embedded and formed in the p-type semiconductor layer and the internal electrode is made of a composite oxide principally composed of a rare earth element such as La and Ni, it becomes possible to reduce the resistance of the p-type semiconductor layer more effectively.

Thus in the ultraviolet sensor of the present invention, it is preferred that the internal electrode is embedded in the p-type semiconductor layer, and the internal electrode is made of a composite oxide principally composed of a rare earth element and Ni.

In addition, in the ultraviolet sensor of the present invention, the above-mentioned rare earth element is preferably La.

Moreover, by joining the n-type semiconductor layer to the p-type semiconductor layer in the form in which a part of the p-type semiconductor layer is exposed, ultraviolet light can reach an interface between the p-type semiconductor layer and the n-type semiconductor layer without transmitting through the n-type semiconductor layer when the ultraviolet sensor is irradiated with ultraviolet light, and thereby, an ultraviolet sensor having higher sensitivity can be attained.

That is, in the ultraviolet sensor of the present invention, the n-type semiconductor layer is preferably joined to the p-type semiconductor layer in the form in which a part of the p-type semiconductor layer is exposed.

In addition, the p-type semiconductor layer containing trivalent Ni can be easily prepared by adding a Ni compound containing trivalent Ni such as nickel oxyhydroxide to NiO and ZnO.

That is, a method for manufacturing an ultraviolet sensor of the present invention is a method for manufacturing an ultraviolet sensor formed by joining a p-type semiconductor layer principally composed of a solid solution of NiO and ZnO to an n-type semiconductor layer principally composed of ZnO, wherein a p-type semiconductor layer preparation step for preparing the p-type semiconductor layer comprises a mixture preparation step of mixing NiO, ZnO and an Ni compound containing trivalent Ni to prepare a mixture; a green sheet preparation step of preparing a green sheet from the mixture; a laminate preparation step of laminating the green sheets to prepare a green laminate; and a firing step of firing the green laminate.

In addition, in the method for manufacturing an ultraviolet sensor of the present invention, the above-mentioned Ni compound is preferably nickel oxyhydroxide.

Moreover, in the method for manufacturing an ultraviolet sensor of the present invention, the Ni compound is preferably added in the range of 0.001 mol to 1 mol.

It becomes possible to embed the internal electrode in the p-type semiconductor layer by firing a laminate which is obtained by applying a paste containing at least a rare earth element to a green sheet, sandwiching the green sheet having the paste applied between green sheets not having a paste, and pressure-bonding these green sheets.

That is, in the method for manufacturing an ultraviolet sensor of the present invention, it is preferred that the above-mentioned p-type semiconductor layer preparation step comprises a paste preparation step of preparing a paste containing at least a rare earth element, and a coated-film forming step of applying the above-mentioned paste onto the surface of the green sheet to form a coated film, and in the above-mentioned laminate preparation step, the predetermined number of the green sheets are laminated so as to sandwich the above-mentioned coated film between the green sheets.

As a method of preparing an internal electrode, there are a method in which a paste containing a composite oxide principally composed of Ni and a rare earth element is applied to a green sheet and fired, and a method in which a paste containing a rare earth element is applied and the rare earth element is reacted with Ni contained in a green sheet to be formed into a p-type semiconductor layer. The former can attain stable characteristics and the latter can be manufactured at low cost.

That is, in the method for manufacturing an ultraviolet sensor of the present invention, it is preferred that the above-mentioned paste preparation step comprises a composite oxide preparation step of preparing a composite oxide from a raw material powder containing a rare earth oxide and a Ni oxide.

In addition, in the method for manufacturing an ultraviolet sensor of the present invention, it is preferred that the above-mentioned paste preparation step prepares a rare earth paste principally composed of a rare earth oxide, and the above-mentioned firing step of firing the green laminate diffuses Ni contained in the green sheet and reacts the Ni with the rare earth element to form an internal electrode made of a composite oxide.

According to the ultraviolet sensor of the present invention, in an ultraviolet sensor comprising a p-type semiconductor layer principally composed of a solid solution of NiO and ZnO, and an n-type semiconductor layer principally composed of ZnO and joined to the p-type semiconductor layer, since the p-type semiconductor layer contains trivalent Ni, a carrier concentration of the semiconductor layer increases, and thereby, it becomes possible to promote the conversion of (Ni, Zn) O to a semiconductor and to reduce a resistance of the p-type semiconductor layer. Accordingly, the intensity of ultraviolet light does not need to be detected by changes in a resistance value and can be detected by a photovoltaic power. Thereby, a peripheral circuit such as a power source circuit does not need to be disposed, and an inexpensive ultraviolet sensor capable of being downsized can be attained.

In addition, when the internal electrode is embedded in the p-type semiconductor layer and the internal electrode is made of a composite oxide principally composed of a rare earth element (e.g., La) and Ni, an expensive noble metal material such as Pt, Pd or the like does not have to be used for the internal electrode material, and therefore an inexpensive ultraviolet sensor with high sensitivity can be attained.

Moreover, when the n-type semiconductor layer is joined to the p-type semiconductor layer in the form in which a part of the p-type semiconductor layer is exposed, ultraviolet light can reach an interface between the p-type semiconductor layer and the n-type semiconductor layer without transmitting through the n-type semiconductor layer when the ultraviolet sensor is irradiated with ultraviolet light, and thereby, an ultraviolet sensor having higher sensitivity can be attained.

In addition, according to the method for manufacturing an ultraviolet sensor of the present invention, since a p-type semiconductor layer preparation step for preparing the p-type semiconductor layer comprises a mixture preparation step of mixing NiO, ZnO and an Ni compound (for example, nickel oxyhydroxide (NiOOH)) containing trivalent Ni to prepare a mixture; a green sheet preparation step of preparing a green sheet from the mixture; a laminate preparation step of laminating the green sheets to prepare a green laminate; and a firing step of firing the green laminate, the trivalent Ni exists in a state of being solid-solved with (Ni, Zn) O even after firing treatment, and thereby, actions as a semiconductor can be maintained and the reduction in resistance of the p-type semiconductor layer can be promoted.

In addition, when the Ni compound is added in the range of 0.001 mol to 1 mol, the above-mentioned operation and effect can be surely exerted.

When the p-type semiconductor layer preparation step comprises a paste preparation step of preparing a paste containing at least a rare earth element and a coated-film forming step of applying the paste onto the surface of the green sheet to form a coated film, and in the laminate preparation step, the predetermined number of the green sheets are laminated so as to sandwich the coated film between the green sheets, an expensive noble metal material such as Pt, Pd or the like does not have to be used for the internal electrode material, and therefore an inexpensive ultraviolet sensor, which can detect the intensity of ultraviolet light by a photovoltaic power, can be manufactured at low cost.

Further, when the paste preparation step comprises a composite oxide preparation step of preparing a composite oxide from a raw material powder containing a rare earth oxide and a Ni oxide, the composition of the internal electrode is stable, and therefore a desired photovoltaic power having more stable characteristics can be obtained by ultraviolet irradiation.

In addition, when the paste preparation step prepares a rare earth paste principally composed of a rare earth oxide, and the firing step of firing the green laminate diffuses Ni contained in the green sheet and reacts the Ni with the rare earth element to form an internal electrode made of a composite oxide, a desired internal electrode can be attained even though a composite oxide for forming an internal electrode is not prepared in advance, and an ultraviolet sensor can be manufactured at low cost.

DETAILED DESCRIPTION OF THE INVENTION

Next, with reference to accompanying drawings, embodiments of the present invention will be described in detail.

Figure 1:
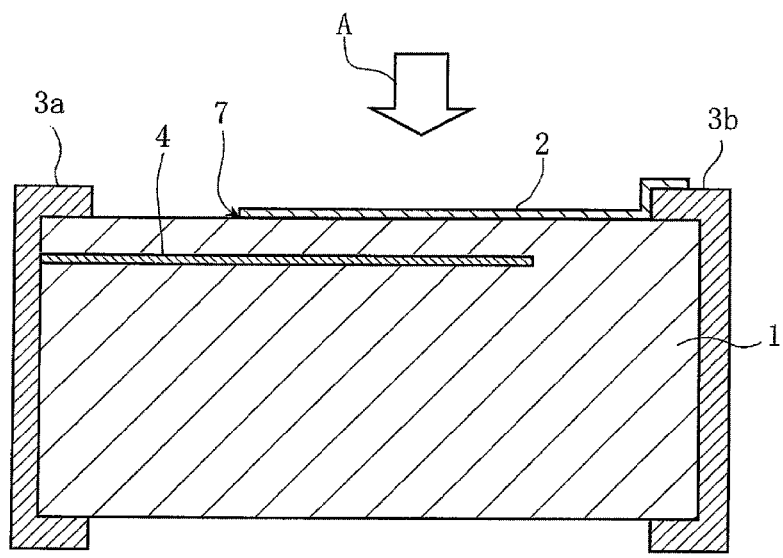
FIG. 1 is a sectional view schematically showing an embodiment of an ultraviolet sensor of the present invention.

FIG. 1 is a sectional view schematically showing an embodiment (first embodiment) of an ultraviolet sensor of the present invention.

That is, this ultraviolet sensor has a p-type semiconductor layer 1 principally composed of a solid solution of NiO and ZnO, and an n-type semiconductor layer 2 made of a ZnO-base material, and the n-type semiconductor layer 2 is joined to the p-type semiconductor layer 1 in the form in which a part of the surface of the p-type semiconductor layer 1 is exposed.

Further, a first terminal electrode 3a and a second terminal electrode 3b are formed at both ends of the p-type semiconductor layer 1. An internal electrode 4 is embedded in the upper portion of the p-type semiconductor layer 1 with an end of the internal electrode exposed to a surface, and the first terminal electrode 3a is formed at one end of the p-type semiconductor layer 1 so as to be electrically connected to the internal electrode 4. The second terminal electrode 3b is formed at the other end of the p-type semiconductor layer 1 so as to be electrically connected to the n-type semiconductor layer 2.

In addition, in the first and second terminal electrodes 3a and 3b, a first plating film made of Ni or the like and a second plating film made of Sn or the like are formed in succession on the surface of an external electrode made of Ag or the like.

In the ultraviolet sensor thus formed, when the sensor is irradiated with ultraviolet light as shown by an arrow A, and a depletion layer formed at a joint interface 7 between the n-type semiconductor layer 1 and the p-type semiconductor layer 2 is irradiated with ultraviolet light, carriers are excited, and thereby a photocurrent is generated; hence, by detecting this photocurrent, the intensity of ultraviolet light can be detected.

The ZnO-base material composing the n-type semiconductor layer 2 may contain trace amounts of additives as long as it is principally composed of ZnO. For example, the ZnO-base material may include Al, Co, In, Ga or the like as a dopant, and may include Fe, Ni or Mn as a diffusing agent. Also, it may include a trace amount of Zr, Si or the like as an impurity, which do not affect semiconductor properties.

In addition, in the p-type semiconductor layer 1, as described above, the principal component is formed of the solid solution of NiO and ZnO and represented by a general formula $(Ni_{1-x}Zn_x)O$ (hereinafter, denoted by (Ni, Zn)O), and trivalent Ni is contained in a crystal grain in a state of being solid-solved with the principal component.

That is, as described above, since (Ni, Zn) O has a lower carrier concentration than ZnO and cannot adequately reduce a resistance, the intensity of ultraviolet light cannot be detected by a photovoltaic power, and therefore, ultraviolet light had to be heretofore detected by changes in a resistance by externally disposing a power source circuit, as described in Patent Document 1.

But in the present embodiment, since the trivalent Ni is contained in a crystal grain in a state of being solid-solved with the (Ni, Zn) O serving as the principal component, the resistance of the p-type semiconductor layer 1 is reduced, and thereby, the intensity of ultraviolet light is detected by a photovoltaic power.

That is, in the (Ni, Zn) O, distortion occurs due to the difference in lattice constant between Ni and Zn, and therefore a carrier concentration is low although the carrier is generated. However, by doping the p-type semiconductor layer with trivalent Ni, since the carrier concentration of the semiconductor layer increases to promote the conversion of (Ni, Zn) O to a semiconductor, it becomes possible to reduce a resistance of the semiconductor layer and to detect the intensity of ultraviolet light as a photovoltaic power. Accordingly, it is not necessary to detect the intensity of ultraviolet light by changes in a resistance value, and thereby, it is not necessary to externally dispose a peripheral device such as a power source circuit or the like and a device can be downsized.

In addition, the form of such a Ni compound to be added is not particularly limited as long as it has trivalent Ni, and for example, nickel oxyhydroxide (NiOOH) can be used. The NiOOH remains in a crystal grain during firing and contributes to promote the conversion of (Ni, Zn) O to a semiconductor.

In addition, the compounding molar ratio x of Zn preferably satisfies a relationship of $0.2 \leq x \leq 0.4$ from the viewpoint of stably obtaining good sensitivity. The reason for this is that when x is less than 0.2, the content of Ni is excessive, and therefore there is a possibility that a resistance is increased. On the other hand, when x is more than 0.4, the content of Zn is excessive, and therefore there is a possibility that ZnO grains are precipitated at a crystal grain boundary and (Ni, Zn) O is converted to an n-type semiconductor.

Further, the internal electrode 4 is preferably made of a composite oxide with a low resistance containing an oxide having a perovskite structure represented by a general formula $RNiO_3$ or an oxide represented by a general formula $R_2NiO_4$, which is principally composed of a rare earth element R and Ni.

That is, since (Ni, Zn) O, a principal component of the p-type semiconductor layer 1, is fired in an oxidizing atmosphere around 1200° C., it is conceivable that in general, a noble metal material such as Pt, Pd or the like is used as the internal electrode material, and the semiconductor layer 1 and the internal electrode material are simultaneously fired.

However, these noble metal materials are expensive, and they has a large work function and form a Schottky barrier between the noble metal material and (Ni, Zn) O. Since the photovoltaic power is consumed by the Schottky barrier, it is difficult to detect the intensity of ultraviolet light as a photovoltaic power. Furthermore, when Pt is used, there is a possibility that a reaction rapidly proceeds in the process of firing due to a catalytic action of Pt, resulting in the occurrence of delamination. Further, when Pd is used, a firm oxide layer is formed at a crystal grain boundary or on the surface of (Ni, Zn) O due to oxygen release of Pd during firing, and consequently an apparent specific resistance of (Ni, Zn) O increases and only a slight photocurrent is generated in the ultraviolet sensor. Accordingly, when the noble metal material is used as the internal electrode material, the intensity of ultraviolet light has to be detected by changes in a resistance value by externally disposing a power source circuit, and it is difficult to avoid increases in price and size of a device.

On the other hand, the composite oxide principally composed of a rare earth element R and Ni is an Ni-base oxide as with (Ni, Zn) O, and since both of the composite oxide and (Ni, Zn) O are close in energy level to each other, they can prevent an unnecessary Schottky barrier from being formed between the composite oxide and (Ni, Zn) O and are in ohmic contact with each other. In addition, the rare earth element is hardly diffused to a (Ni, Zn) O side compared with Ni, and the catalytic action or the oxygen release action do not occur. Therefore, the resistance of (Ni, Zn) O can be further reduced. Furthermore, since the composite oxide principally composed of a rare earth element R and Ni is an Ni-base oxide as with (Ni, Zn) O, it is close to (Ni, Zn) O in shrinkage behavior at elevated temperatures, and therefore it hardly causes delamination between the p-type semiconductor layer 1 and the internal electrode 4 and does not cause a phenomenon in which an electrode is drawn into the inside of a sintered body. Further, since an expensive noble metal material does not have to be used for the internal electrode material, an increase in price of the ultraviolet sensor can be suppressed.

Therefore, as the internal electrode material, the composite oxide principally composed of a rare earth element R and Ni is preferably used.

Such a rare earth element is not particularly limited as long as it has a low resistance when it forms a composite oxide with Ni, and for example, at least one selected from among La, Pr, Nd, Sm, Gd, Dy, Ho, Er and Yb may be used. Among these elements, inexpensive La is preferably used from the viewpoint of economics.

Next, a method for manufacturing the above-mentioned ultraviolet sensor will be described in detail.

[Preparation of ZnO Sintered Body]

A ZnO powder, and various additives to be used as required such as a doping agent, a diffusing agent and the like are prepared and weighed in predetermined amounts. A solvent such as pure water is added to these weighed compounds, and the resulting mixture is adequately mixed and pulverized in a wet manner by using a ball mill employing balls such as PSZ (partially stabilized zirconia) beads or the like as a pulverizing medium to obtain a slurry-like mixture. Subsequently, after the slurry-like mixture is dehydrated and dried, the slurry is granulated to have a predetermined particle diameter, and then resulting grains are calcinated for about 2 hours at a predetermined temperature to obtain a calcined powder. Next, after a solvent such as pure water is again added to the calcined powder thus obtained, the resulting mixture is adequately pulverized in a wet manner by using a ball mill employing balls as a pulverizing medium to obtain a slurry-like pulverized material. Next, the slurry-like pulverized material is dehydrated and dried, and then pure water, a dispersing agent, a binder, a plasticizer and the like are added to prepare a slurry for forming. Thereafter, the slurry for forming is formed into a ZnO green sheet having a predetermined thickness by using a method of forming such as a doctor blade method. Subsequently, the predetermined number of the ZnO green sheets are laminated and then pressure-boned to prepare a pressure-boned product. Then, after the pressure-boned product is degreased, it is fired to obtain a ZnO sintered body.

[Preparation of (Ni, Zn) O Green Sheet]

A NiO powder and a ZnO powder are weighed so that the compounding molar ratio x of Zn is 0.2 to 0.4, and further a trivalent Ni compound such as NiOOH or the like is added to these weighed compounds, and thereafter, a solvent such as pure water or the like is added, and the resulting mixture is adequately mixed and pulverized in a wet manner in a ball mill using balls as a pulverizing medium to obtain a slurry-like mixture.

Herein, an additive amount of the above-mentioned Ni compound is preferably 0.001 mol or more in order to achieve a desired effect of addition. An upper limit of the additive amount is not particularly limited but it is preferably 1 mol or less. The reason for this is that even if the Ni compound is added in an amount more than 1 mol %, it changes to NiO during firing and the amount of trivalent Ni does not increase.

Next, this mixture is dehydrated, dried, and granulated to have a predetermined particle diameter, and then calcinated for about 2 hours at a predetermined temperature to obtain a calcined powder. Next, after a solvent such as pure water is again added to the calcined powder thus obtained, the resulting mixture is adequately pulverized in a wet manner in a ball mill using balls as a pulverizing medium to obtain a slurry-like pulverized material. Next, the slurry-like pulverized material is dehydrated and dried, and then an organic solvent, a dispersing agent, a binder, plasticizer and the like are added to prepare a slurry for forming. The slurry for forming is formed by using a method of forming such as a doctor blade method to obtain, and thereby, a (Ni, Zn) O green sheet having a predetermined thickness is obtained.

[Preparation of Paste for Forming Internal Electrode]

A NiO powder and a $R_2O_3$ powder (R: a rare earth element) are weighed so that the proportion of moles between these compounds is 2:1, and then a solvent such as pure water is added to these weighed compounds, and the resulting mixture is adequately mixed and pulverized in a wet manner in a ball mill using balls as a pulverizing medium to obtain a slurry-like mixture. Subsequently, after the slurry-like mixture is dehydrated and dried, the slurry is granulated to have a predetermined particle diameter, and then resulting grains are calcinated for about 2 hours at a predetermined temperature to obtain a calcined powder. Next, after a solvent such as pure water is again added to the calcined powder thus obtained, the resulting mixture is adequately pulverized in a wet manner in a ball mill using balls as a pulverizing medium to obtain a slurry-like pulverized material. Next, the slurry-like pulverized material is dehydrated and dried to obtain a composite oxide powder principally composed of a rare earth element R and Ni. Then, the obtained composite oxide powder is mixed with an organic vehicle and the resulting mixture is kneaded with a three roll mill to prepare a paste for forming an internal electrode.

In addition, the organic vehicle is formed by dissolving a binder resin in an organic solvent, and the proportion between the binder resin and the organic solvent is adjusted so as to be 1 to 3:7 to 9, for example, in terms of a volume ratio. The binder resin is not particularly limited, and for example, an ethyl cellulose resin, a nitrocellulose resin, an acrylic resin, an alkyd resin, or a combination of these resins can be used. Further, the organic solvent is not particularly limited, and α-terpineol, xylene, toluene, diethylene glycol monobutyl ether, diethylene glycol monobutyl ether acetate, diethylene glycol monoethyl ether, and diethylene glycol monoethyl ether acetate can be used singly, or can be used in combination thereof.

[Preparation of Green Laminate]

Figure 2:
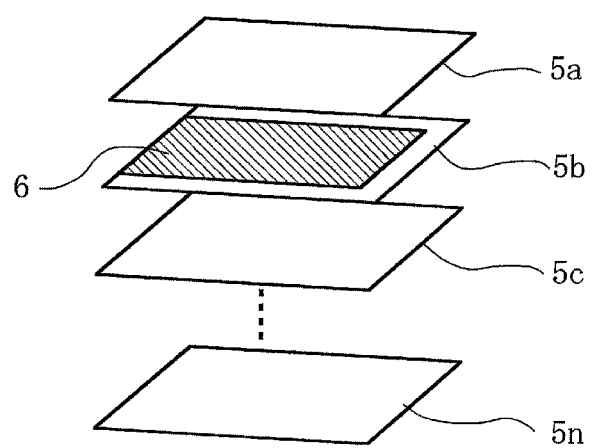
FIG. 2 is an exploded perspective view of a green laminate.

A method of preparing a green laminate will be described with reference to FIG. 2

First, the predetermined numbers of (Ni, Zn) O green sheets $5a$, $5b$, $5c$, . . . , and $5n$ are prepared, and onto the surface of a (Ni, Zn) O green sheet $5b$ of these green sheets, the above-mentioned paste for forming an internal electrode is applied to form a conductive film (coated film) 6.

Next, the predetermined numbers of (Ni, Zn) O green sheets $5c$ to $5n$ not provided with the conductive film are laminated, and the (Ni, Zn) O green sheet $5b$, provided with the conductive film 6 is laminated thereon, and further a (Ni, Zn) O green sheet $5a$ not provided with the conductive film is laminated thereon, and these sheets are pressure-bonded to prepare a green laminate.

[Preparation of P-Type Semiconductor Layer 1]

The green laminate is adequately degreased, and then fired at a temperature around 1200° C. for about 5 hours to simultaneously fire the conductive film 6 and the (Ni, Zn) O green sheets $5a$ to $5n$, and thereby, a p-type semiconductor layer 1, in which an internal electrode 4 is embedded and $Ni^{3+}$ of NiOOH exists in a state of being solid-solved with (Ni, Zn) O, is obtained.

[Preparation of Terminal Electrode $3a$, $3b$]

A paste for forming an external electrode is applied to both ends of the p-type semiconductor layer 1 and fired to form an external electrode. Herein, a conductive material of the paste for forming an external electrode is not particularly limited as long as it has a good electric conductivity, and Ag, Ag—Pd and the like can be used as the conductive material.

Thereafter, electroplating is performed to form a plating film having a two-layer structure composed of a first plating film and a second plating film, and thereby, a first terminal electrode $3a$ and a second terminal electrode $3b$ are formed.

[Formation of N-Type Semiconductor Layer 2]

Sputtering is performed through a metal mask having a predetermined opening using a ZnO sintered body as a target to form an n-type semiconductor layer 2 composed of a ZnO-base thin film on the surface of a p-type semiconductor layer 1 so that a part of the p-type semiconductor layer 1 is exposed and the n-type semiconductor layer 2 is electrically connected to a second terminal electrode $3b$, and thereby, an ultraviolet sensor is obtained.

Thus, in the present embodiment, since the p-type semiconductor layer 1 contains trivalent Ni, a carrier concentration of the semiconductor layer increases, and thereby, it becomes possible to promote the conversion of (Ni, Zn) O to a semiconductor and to reduce a resistance of the p-type semiconductor layer. Accordingly, it becomes possible to detect the intensity of ultraviolet light by a photovoltaic power, and detection by changes in a resistance value is unnecessary. Thereby, a peripheral circuit such as a power source circuit does not need to be disposed, and an inexpensive ultraviolet sensor capable of being downsized can be attained.

Further, in the present embodiment, the trivalent Ni exists in a crystal grain in a state of being solid-solved with (Ni, Zn) O even after firing treatment since an ultraviolet sensor is manufactured by mixing NiO, ZnO and an Ni compound containing trivalent Ni to prepare a mixture, then preparing a green sheet from the mixture, laminating the green sheets to prepare a green laminate, and thereafter firing the green laminate. Therefore, actions as a semiconductor can be maintained and the reduction in resistance of the p-type semiconductor layer is promoted.

In addition, since the internal electrode 4 is embedded in the p-type semiconductor layer 1 and the internal electrode 4 is made of a composite oxide principally composed of a rare earth element and Ni, an expensive noble metal material such as Pt, Pd or the like does not have to be used for the internal electrode material, and therefore an inexpensive ultraviolet sensor with high sensitivity can be attained.

Moreover, since the n-type semiconductor layer 2 is joined to the p-type semiconductor layer 1 in the form in which a part of the p-type semiconductor layer 1 is exposed, ultraviolet light can reach an interface between the p-type semiconductor layer and the n-type semiconductor layer without transmitting through the n-type semiconductor layer 2 when the ultraviolet sensor is irradiated with ultraviolet light, and thereby, an ultraviolet sensor having higher sensitivity can be attained.

In addition, in the above embodiment, a paste for forming an internal electrode containing $RNiO_3$ is prepared, and the paste for forming an internal electrode is applied onto the surface of a (Ni, Zn) O green sheet and fired to form an internal electrode 4. However, as a modification example, a method is preferred, in which the paste for forming an internal electrode does not include Ni, and a rare earth paste including a principal component composed of a rare earth oxide $R_2O_3$ is prepared as the paste for forming an internal electrode, and the rare earth paste is embedded in the (Ni, Zn) O green sheet at the time of firing.

An ultraviolet sensor of the modification example can be prepared by following procedure.

That is, as with the above-mentioned embodiment, a ZnO sintered body and a (Ni, Zn) O green sheet are prepared.

Subsequently, an $R_2O_3$ powder is mixed with the above-mentioned organic vehicle and the resulting mixture is kneaded with a three roll mill to prepare a rare earth paste.

Thereafter, the rare earth paste is applied onto the surface of the (Ni, Zn) O green sheet $5b$ to form a rare earth film.

Next, the predetermined numbers of (Ni, Zn) O green sheets $5c$ to $5n$ not provided with the rare earth film are laminated, and a (Ni, Zn) O green sheet $5b$ provided with the rare earth film is laminated thereon, and further a (Ni, Zn) O green sheet $5a$ not provided with the rare earth film is laminated thereon, and these sheets are pressure-bonded to prepare a green laminate.

Then, the green laminate is adequately degreased, and then fired at a temperature around 1200° C. for about 5 hours to simultaneously fire the conductive film 6 and the (Ni, Zn) O green sheets 5a to 5n, and thereby, a p-type semiconductor layer 1 in which an internal electrode 4 is embedded is obtained. In this firing treatment, the rare earth element R is hardly diffused to the (Ni, Zn) O green sheet side, and Ni in the (Ni, Zn) O green sheet is diffused to the rare earth film side, and thereby, the internal electrode made of a composite oxide principally composed of a rare earth element and Ni is formed during firing.

Thereafter, a first terminal electrode $3a_,$, a second terminal electrode $3b$, and an n-type semiconductor layer 2 are formed in succession by the same method/procedure as in the above-mentioned embodiment, and thereby, an ultraviolet sensor is prepared.

Thus, the composite oxide principally composed of a rare earth element and Ni is formed during firing even though the composite oxide is not previously synthesized as a paste for forming an internal electrode, and therefore the ultraviolet sensor can be manufactured at low cost. However, in the case of the above modification example, it is preferred to control firing conditions since the composition of (Ni, Zn) O easily fluctuates during firing and therefore a heterophase of $R_2NiO_6$ is easily produced.

In addition, the above embodiment is an exemplification of an embodiment of the present invention, and it is to be understood that variations may be made without departing from the gist of the present invention.

Next, an example of the present invention will be described in detail.

EXAMPLE 1

[Preparation of ZnO Sintered Body]

ZnO serving as a principal component and $Ga_2O_3$ as a doping agent were weighed so that compounding ratios of these compounds were 99.9 mol % and 0.1 mol %, respectively, and after pure water was added to these weighed compounds, the resulting mixture was mixed and pulverized in a ball mill using PSZ beads as a pulverizing medium to obtain a slurry-like mixture of particles having an average particle diameter of 0.5 µm or less. Subsequently, after the slurry-like mixture was dehydrated and dried, the slurry was granulated to have a particle diameter of about 50 µm, and then resulting grains were calcinated for 2 hours at 1200° C. to obtain a calcined powder.

Next, after pure water was again added to the calcined powder thus obtained, the resulting mixture was mixed and pulverized in a ball mill using PSZ beads as a pulverizing medium to obtain a slurry-like pulverized material of particles having an average particle diameter of 0.5 µm. Next, the slurry-like pulverized material was dehydrated and dried, and then pure water and a dispersing agent were added thereto and mixed therewith, and a binder and a plasticizer were further added to prepare a slurry for forming. The slurry for forming was formed into a green sheet having a thickness of 20 µm by using a doctor blade method. Subsequently, the predetermined number of the green sheets was laminated to have a thickness of 20 mm, and was then pressure-boned for 5 minutes at a pressure of 250 MPa to obtain a pressure-boned product. Then, after the pressure-boned product was degreased, it was fired at 1200° C. for 20 hours to obtain a ZnO sintered body.

[Preparation of (Ni, Zn) O Green Sheet]

A NiO powder and a ZnO powder were weighed so that the proportion of moles between these compounds was 7:3, and further NiOOH was weighed so that the content of NiOOH was 0 to 1 mol. Then, pure water was added to these weighed compounds, and the resulting mixture was mixed and pulverized in a ball mill using PSZ beads as a pulverizing medium to obtain a slurry-like mixture. Subsequently, after the slurry-like mixture was dehydrated and dried, the slurry was granulated to have a particle diameter of about 50 µm, and then resulting grains were calcinated for 2 hours at 1200° C. to obtain a calcined powder. Next, after pure water was again added to the calcined powder thus obtained, the resulting mixture was pulverized in a ball mill using PSZ beads as a pulverizing medium to obtain a slurry-like pulverized material of particles having an average particle diameter of 0.5 µm. Next, the slurry-like pulverized material was dehydrated and dried, and then an organic solvent and a dispersing agent were added thereto and mixed therewith, and a binder and a plasticizer were further added to prepare a slurry for forming. The slurry for forming was formed into a (Ni, Zn) O green sheet having a thickness of 10 µm by using a doctor blade method,

[Paste for Internal Electrode]

A NiO powder and a $La_2O_3$, powder as a rare earth oxide were weighed so that the proportion of moles between these compounds was 2:1, and then pure water was added to these weighed compounds, and the resulting mixture was mixed and pulverized in a ball mill using PSZ beads as a pulverizing medium to obtain a slurry-like mixture. Subsequently, after the slurry-like mixture was dehydrated and dried, the slurry was granulated to have a particle diameter of about 50 µm, and then resulting grains were calcinated for 2 hours at 1200° C. to obtain a calcined powder. Next, after pure water was again added to the calcined powder thus obtained, the resulting mixture was pulverized in a ball mill using PSZ beads as a pulverizing medium to obtain a slurry-like pulverized material of particles having an average particle diameter of 0.5 µm. The slurry-like pulverized material was dehydrated and dried to obtain a $LaNiO_3$ powder. Thereafter, the obtained $LaNiO_3$, powder was mixed with an organic vehicle and the resulting mixture was kneaded with a three roll mill to prepare a paste for forming an internal electrode. In addition, the organic vehicle was prepared by mixing an ethyl cellulose resin and α-terpineol so that the percentage of the ethyl cellulose resin as a binder resin was 30 vol % and the percentage of α-terpineol as an organic solvent was 70 vol %.

[Preparation of Green Laminate]

A paste for forming an internal electrode was applied onto the surface of one of the (Ni, Zn) O green sheets by a screen printing method, and dried for 1, hour at 60° C. to form a conductive film having a predetermined pattern.

Subsequently, 20 (Ni, Zn) O green sheets not provided with the conductive film were laminated, and a (Ni, Zn) O green sheet provided with the conductive film was laminated thereon, and further a (Ni, Zn) O green sheet not provided with the conductive film was laminated thereon. These sheets were pressure-bonded at a pressure of 200 MPa to form a laminate, and the resulting laminate was cut into a size of 2.5 mm×1.5 mm to prepare a green laminate.

[Preparation of P-Type Semiconductor Layer]

The green laminate was adequately degreased at 300° C., and then fired at 1200° C. for 3 hours to obtain a p-type semiconductor layer.

[Preparation of Terminal Electrode]

An Ag—Pd paste (Ag/Pd=95/5) was applied to both ends of the p-type semiconductor layer and fired at 850° C. to form a first and a second external electrodes. Then, the surfaces of the first and the second external electrodes were plated by electroplating to form a Ni coating and a Sn coating in succession, and thereby, a first terminal electrode and a second terminal electrode were formed.

[Formation of N-Type Semiconductor Layer]

Sputtering was performed through a metal mask using a ZnO sintered body as a target so that an n-type semiconductor layer covers a part of one main surface of a p-type semiconductor layer and overlaps a part of a second terminal electrode to prepare an n-type semiconductor layer with a predetermined pattern having a thickness of about 0.5 μm. Thereby, samples of sample No. 1 to 5 were obtained. Here, the additive amount of NiOOH was 0.001 mol for the sample No. 1, 0.01 mol for the sample No. 2, 0.1 mol for the sample No. 3, 1 mol for the sample No. 4, and 0 mol (non addition) for the sample No. 5.

[Evaluation of Samples]

Figure 3:
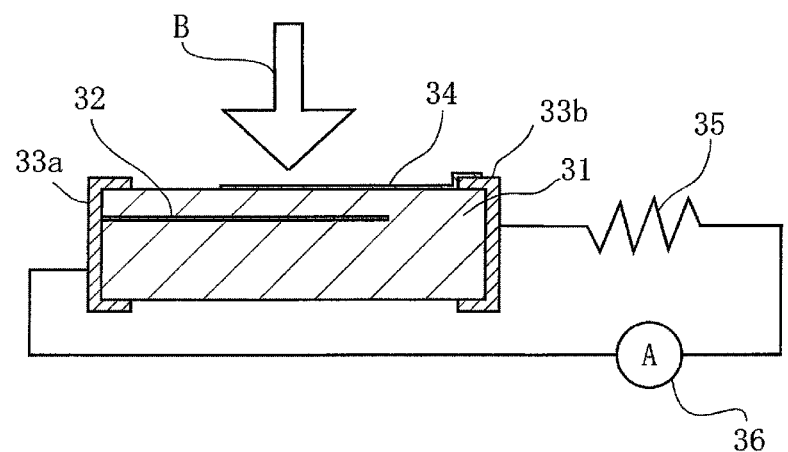
FIG. 3 is a view showing a measurement method of an output current of an example.

In each of samples from No. 1 to No. 5, as shown in FIG. 3, an internal electrode 32 is embedded in a p-type semiconductor layer 31, a first terminal electrode 33a and a second terminal electrode 33b are formed at both ends of the p-type semiconductor layer 31, and an n-type semiconductor layer 34 is joined to the surface of the p-type semiconductor layer 31. The first terminal electrode 33a and the second terminal electrode 33b were connected to an ammeter 36 through a resistance 35. Then, in a darkroom, the outer surface on the n-type semiconductor layer 34 side of each sample was irradiated with ultraviolet light having a wavelength of 365 nm from an ultraviolet light source equipped with a spectroscope as shown by an arrow B, and a photocurrent flowing between the first terminal electrode 33a and the second terminal electrode 33b was measured with the ammeter 36.

In addition, the irradiance of the ultraviolet light was set at 0.003 to 10 mW/cm$^2$, and a measurement temperature was controlled to be 25° C.±1° C.

Figure 4:
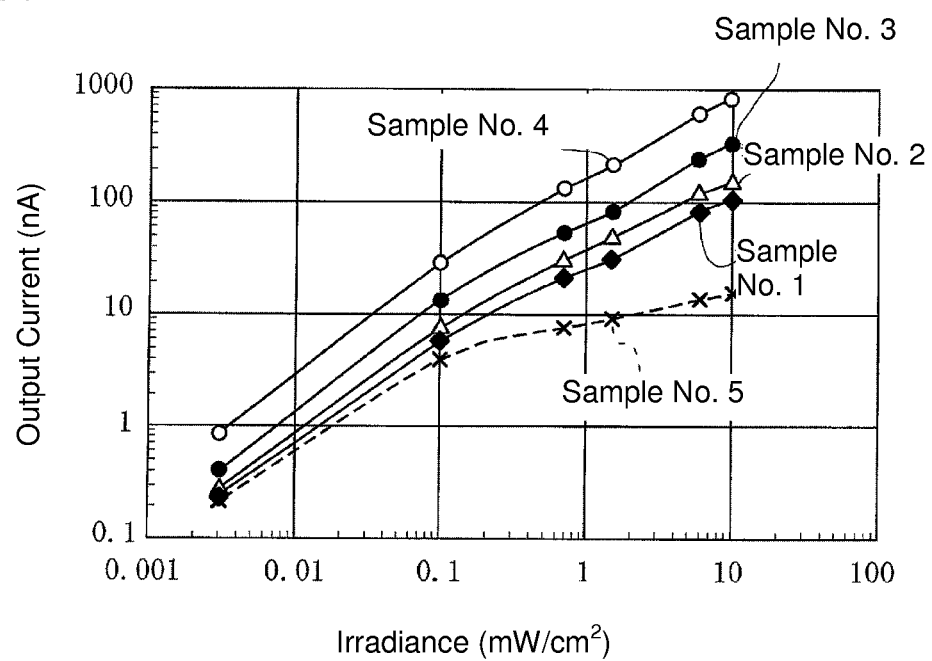
FIG. 4 is a view showing a relationship between irradiance and the output current in the example.

FIG. 4 shows the measurement results, and a horizontal axis represents an irradiance (mW/cm$^2$) and a vertical axis represents an output current (nA). Further, in FIG. 4, a symbol ♦ indicates the sample No. 1, a symbol Δ indicates the sample No. 2, a symbol ● indicates the sample No. 3, a symbol ○ indicates the sample No. 4, and a symbol × indicates the sample No. 5.

It was found that since the sample No. 5, does not contain the trivalent Ni, it has a relatively low output current, and has difficulty in attaining a desired large output current even if the irradiance is increased.

On the other hand, it was found that since the sample Nos. 1 to 4 contain the trivalent Ni, its output current increases in approximate proportion to the irradiance. Further, it was also found that the output current increases as the additive amount of NiOOH increases.

Next, with reference to the sample No. 3, a wavelength responsive property at the time when the irradiance was set at 1 mW/cm$^2$ and the wavelength of the ultraviolet light source was varied in increments of 10 nm from 200 nm to 600 nm.

Figure 5:
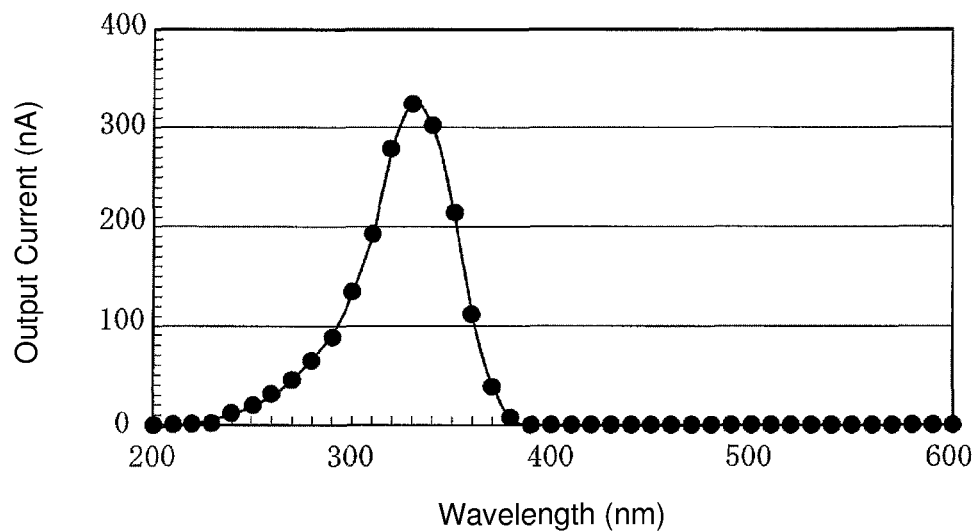
FIG. 5 is a view showing a relationship between a wavelength of a sample No. 1, and the output current in the example.

FIG. 5 shows the measurement results, and a horizontal axis represents a wavelength (nm) and a vertical axis represents an output current (nA).

As is apparent from FIG. 5, the ultraviolet sensor of the present invention responds to only ultraviolet light with a wavelength of 380 nm or less and does not respond to visible light with a wavelength of 500 nm or more at all, and the ultraviolet sensor of the present invention was found to have a good wavelength responsive property for ultraviolet light.

Next, with reference to samples of the sample Nos. 3 to 5, electron spin resonance (ESR) spectra were measured under liquid helium to investigate whether Ni$^{3+}$ is observed or not.

Figure 6:
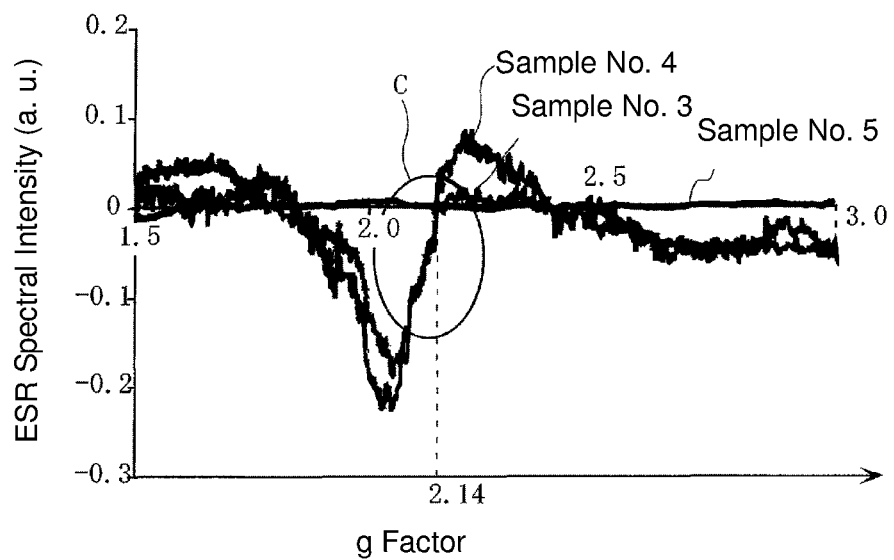
FIG. 6 is a view showing an ESR spectral intensity in the example together with a comparative example.
Figure 7:
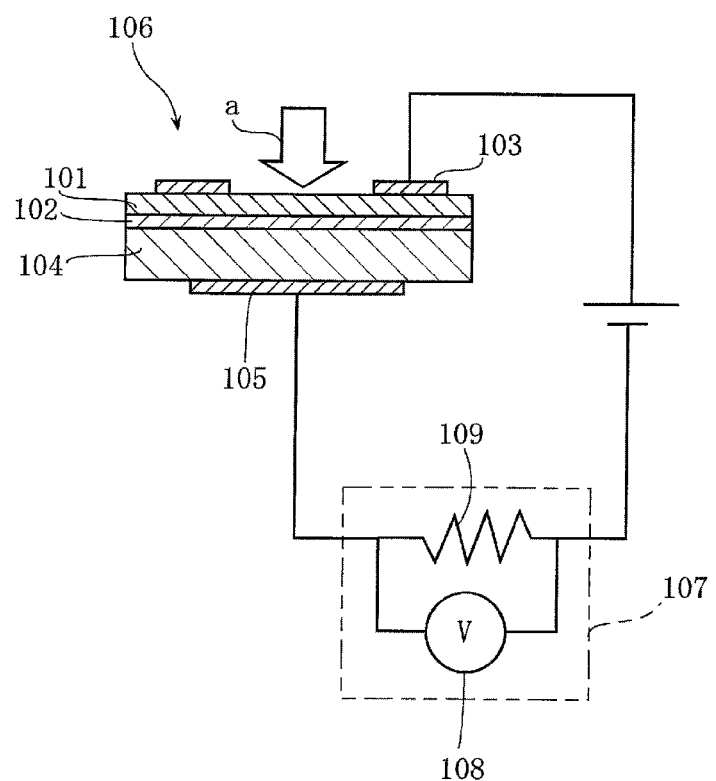
FIG. 7 is a view showing an ultraviolet sensor and a detection method of a voltaic power described in Patent Document 1.

FIG. 6 shows the observed ESR spectra, and a horizontal axis represents a g factor and a vertical axis represents spectral intensity (a. u.). In FIG. 6, C represents the occurrence of a Ni$^{3+}$ spectrum.

As is apparent from FIG. 6, in both of the sample Nos. 3 and 4, in the vicinity of the g factor of 2.14 the Ni$^{3+}$ spectrum was observed and the existence of a trivalent Ni was confirmed.

Next, areas of the sample Nos. 3 and 4 on an ESR spectral curve were compared with each other. That is, when the ESR spectral curve is integrated, since each value of integral can be considered as the number of Ni$^{3+}$s, both areas are compared, and thereby, a ratio of the number of Ni$^{3+}$s was evaluated.

Consequently, the number of Ni$^{3+}$s contained in the sample was 245 for the sample No. 3, and 598 for the sample No. 4, and a ratio of the latter to the former (sample No. 4/sample No. 3) was about 2.4. That is, it was found that the number of Ni$^{3+}$s is increased by increasing the additive amount of NiOOH from 0.1 mol % (sample No. 3) to 1 mol % (sample No. 4). It is thought that the increase in the number of Ni$^{3+}$s contributes to an increase of output current as shown in FIG. 4.

The detection of the intensity of ultraviolet light by a photovoltaic power eliminates the necessity to externally dispose a power source circuit or the like to detect the intensity of ultraviolet light by changes in a resistance value, and thereby, it becomes possible to realize a compact and inexpensive ultraviolet sensor.

DESCRIPTION OF REFERENCE SYMBOLS 1 p-type semiconductor layer
2 n-type semiconductor layer
4 internal electrode
5a to 5n (Ni, Zn) O green sheet
6 conductive film (coated film)

The invention claimed is:

1. An ultraviolet sensor comprising:
   a p-type semiconductor layer composed of a solid solution of NiO and ZnO; and
   an n-type semiconductor layer composed of ZnO and joined to the p-type semiconductor layer,
   wherein the p-type semiconductor layer contains trivalent Ni.

2. The ultraviolet sensor according to claim 1, further comprising an internal electrode is embedded in the p-type semiconductor layer.

3. The ultraviolet sensor according to claim 2, wherein the internal electrode is a composite oxide composed of a rare earth element and Ni.

4. The ultraviolet sensor according to claim 3, wherein the rare earth element is La.

5. The ultraviolet sensor according to claim 1, further comprising:
   a first terminal electrode on a first end of the p-type semiconductor layer, the first terminal electrode being electrically connected to the internal electrode; and
   a second terminal electrode on a second end of the p-type semiconductor layer.

6. The ultraviolet sensor according to claim 1, wherein the n-type semiconductor layer is joined to the p-type semiconductor layer such that a part of the p-type semiconductor layer is exposed.

7. The ultraviolet sensor according to claim 1, wherein the trivalent Ni is contained in a crystal grain of the p-type semiconductor layer in a state of being solid-solved with the solid solution of NiO and ZnO.

8. The ultraviolet sensor according to claim 1, wherein a compounding molar ratio x of Zn in the p-type semiconductor layer is $0.2 \leq x \leq 0.4$.

* * * * *

UNITED STATES PATENT AND TRADEMARK OFFICE
CERTIFICATE OF CORRECTION

| | | |
|---|---|---|
| PATENT NO. | : 9,064,990 B2 | Page 1 of 1 |
| APPLICATION NO. | : 13/706435 | |
| DATED | : June 23, 2015 | |
| INVENTOR(S) | : Kazutaka Nakamura | |

It is certified that error appears in the above-identified patent and that said Letters Patent is hereby corrected as shown below:

ON THE TITLE PAGE

Assignee reads:

(73) Assignee: MURATO MANUFACTURING CO., LTD., Nagaokakyo-shi, Kyoto-Fu (JP)

Assignee should read:

(73) Assignee: MURATA MANUFACTURING CO., LTD., Nagaokakyo-shi, Kyoto-Fu (JP)

Signed and Sealed this
Twenty-second Day of December, 2015

Michelle K. Lee
*Director of the United States Patent and Trademark Office*